United States Patent [19]

Harford

[11] 4,260,956

[45] Apr. 7, 1981

[54] TEMPERATURE COMPENSATING BIAS CIRCUIT

[75] Inventor: Jack R. Harford, Flemington, N.J.

[73] Assignee: RCA Corporation, New York, N.Y.

[21] Appl. No.: 21,322

[22] Filed: Mar. 16, 1979

[51] Int. Cl.³ .............................................. H03F 3/04
[52] U.S. Cl. .................................... 330/289; 330/279; 330/283
[58] Field of Search ............... 330/266, 268, 272, 274, 330/279, 283, 289

[56] References Cited

U.S. PATENT DOCUMENTS

| | | | |
|---|---|---|---|
| 3,136,928 | 6/1964 | Avis | 330/289 X |
| 3,421,102 | 1/1969 | Andrews | 330/289 |
| 3,505,535 | 4/1970 | Cavaliero | 307/203 |
| 3,579,133 | 5/1971 | Harford | 330/283 |
| 3,629,717 | 12/1971 | Bisgaard | 330/266 X |

*Primary Examiner*—James B. Mullins
*Attorney, Agent, or Firm*—Eugene M. Whitacre; William H. Meagher; W. Brinton Yorks, Jr.

[57] ABSTRACT

A biasing circuit is provided for stabilizing the gain of a transistor amplifier against variations in temperature. The amplifier includes an input terminal and a transistor having a base-to-emitter junction coupled between the input terminal and the second terminal of a two-terminal source of supply potential. The biasing circuit is coupled between the two supply terminals and includes a resistor coupled to the first terminal, a semiconductor rectifying junction coupled between the input terminal of the amplifier and the second supply terminal, and the parallel combination of the collector-to-emitter path of a second transistor and a voltage divider coupled between the resistor and the rectifying junction. The base of the second transistor is coupled to an intermediate tap of the voltage divider. As the temperature of the circuit increases, the $g_m$ of the amplifying transistor decreases. The biasing circuit conducts an increasing amount of current to the amplifier as the operating temperature of the circuit increases. This increase in biasing current causes an increase in the collector current of the amplifying transistor, which stabilizes the $g_m$ and hence the gain of the amplifier.

15 Claims, 1 Drawing Figure

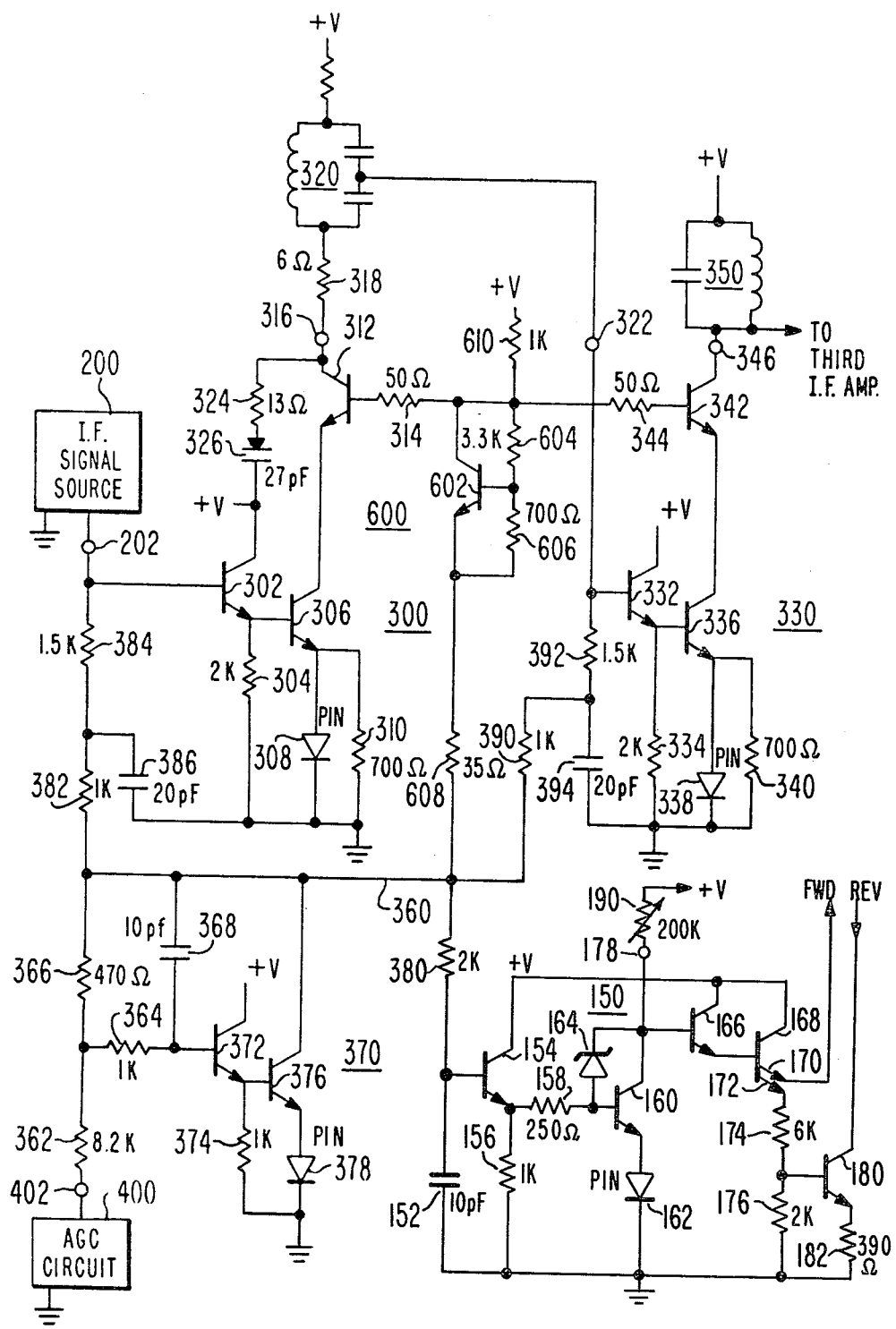

TEMPERATURE COMPENSATING BIAS CIRCUIT

This invention relates to temperature stabilized transistor circuits in general and, in particular, to a biasing circuit for stabilizing the gain of a transistor amplifier in the presence of temperature variations.

The voltage gain of a common emitter configured transistor amplifier may be expressed as $$V \text{ Gain} = R_L g_m \quad (1)$$

where $R_L$ is the impedance of the load coupled at the collector electrode and $g_m$ is the transconductance of the transistor expressed in mhos. As is well known, the voltage gain of a transistor amplifier varies with changes in the operating temperature of the circuit. This is because the transconductance contains a temperature dependent term, and is expressed as $$g_m = \frac{-d\,Ic}{d\,V_{be}} = \frac{q}{kT}|Ic| \quad (2)$$

where Ic is the collector current, $V_{be}$ is the base-to-emitter voltage, q is the electronic charge, k is Boltzmann's constant, |Ic| denotes the magnitude of the quiescent collector current, and T is the absolute temperature. Since the $g_m$ is inversely proportional to temperature, an increase in temperature will cause the $g_m$ to decrease, resulting in a decrease in the gain of the transistor amplifier. Moreover, since the absolute temperature of a transistor can increase by as much as forty to fifty-five degrees Kelvin from the time power is applied at room temperature until the transistor reaches its stable operating temperature, it can be seen that the gain of a transistor amplifier is significantly influenced by these normal temperature variations.

In accordance with the principles of the present invention, a biasing circuit is provided for stabilizing the gain of a transistor amplifier against variations in temperature. The amplifier includes an input terminal and a transistor having a base-to-emitter junction coupled between the input terminal and the second terminal of a two-terminal source of supply potential. The biasing circuit is coupled between the two supply terminals and includes a resistor coupled to the first terminal, a semiconductor rectifying junction coupled between the input terminal of the amplifier and the second supply terminal, and the parallel combination of the collector-to-emitter path of a second transistor and a voltage divider coupled between the resistor and the rectifying junction. The base of the second transistor is coupled to an intermediate tap of the voltage divider. As the temperature of the circuit increases, the $g_m$ of the amplifying transistor decreases. The voltage drops across the biasing circuit elements arranged as described above will cause the biasing circuit to conduct an increasing amount of current to the amplifier as the operating temperature of the circuit increases. This increase in biasing current causes an increase in the collector current of the amplifying transistor, which stabilizes the $g_m$ and hence the gain of the amplifier.

In accordance with a further aspect of the present invention, the rectifying junction comprises a third transistor having a collector-to-emitter path coupled between the input terminal of the amplifier and the second supply terminal. A second resistor is coupled between the base and collector electrodes of the third transistor. The base electrode of the third transistor is responsive to a gain control voltage for reducing the voltage at its collector electrode and thereby control the gain of the transistor amplifier.

In a preferred embodiment of the present invention, the third transistor is coupled to form a replica, or dummy, of the transistor amplifier. Current conducted by the third transistor will be replicated in the first transistor in a proportion determined by the emitter areas of the two transistors, thereby stabilizing the quiescent biasing of the transistor amplifier.

In accordance with yet another aspect of the present invention, the biasing circuit can be constructed to provide the necessary D.C. biasing for a cascode transistor amplifier.

The sole FIGURE illustrates, partially in schematic diagram form and partially in block diagram form, an embodiment of the present invention.

Referring to the FIGURE, a television intermediate frequency (I.F.) amplifier embodying the principles of the present invention is shown. In general, the amplifier is comprised of first and second I.F. amplifying stages 300 and 330, which amplify I.F. signals supplied by a source 200. A dummy bias circuit 370 is responsive to a gain control signal supplied by an automatic gain control (AGC) circuit 400 for controlling the gain of the I.F. amplifiers and for biasing a radio frequency (R.F.) AGC biasing circuit 150. The I.F. amplifiers, dummy bias circuit, and R.F. AGC biasing circuit are compensated for gain changes due to temperature variations by a multiple $V_{be}$ biasing circuit 600. The dummy bias circuit 370 and the multiple $V_{be}$ biasing circuit 600 are also arranged to provide proper biasing for the cascode amplifier stages in the first and second I.F. amplifiers 300 and 330. The I.F. amplifiers 300 and 330, the dummy bias circuit 370, the R.F. AGC biasing circuit 150, and the multiple $V_{be}$ biasing circuit 600 may be conveniently fabricated on a single monolithic integrated circuit chip having contact areas for coupling to circuit components, signal sources, and power supplies external to the chip. Fabrication in integrated circuit form also ensures the circuits will be subject to the same variations in ambient temperature, thereby permitting temperature compensation of all of the circuits by a single temperature compensating bias circuit.

The circuits shown in the FIGURE amplify I.F. signals supplied by an I.F. signal source 200. These I.F. signals are generally developed by a mixer in the television tuner, and are located in an I.F. passband formed by a filter network prior to the I.F. amplifier. The I.F. signal source 200 is coupled to the I.F. amplifier at an external contact terminal 202. The contact terminal 202 is coupled to the base of a buffer transistor 302 of a first I.F. amplifier 300. The collector of transistor 302 is coupled to a source of supply voltage (+V), and its emitter is coupled to a source of reference voltage (ground) by a resistor 304. The emitter of transistor 302 is also coupled to the base of a transistor 306. The emitter of transistor 306 is coupled to ground by the parallel combination of a resistor 310 and a forward biased PIN diode 308. The collector of transistor 306 is coupled to the emitter of a transistor 312, which has its base coupled to a multiple $V_{be}$ biasing circuit 600 by a resistor 314, and its collector coupled to an external contact terminal 316. The collector of transistor 312 is also coupled to the +V supply by the serial connection of a resistor 324 and a voltage-variable capacitive device 326, which acts to peak the response of the amplifier in the vicinity of the picture carrier under weak signal conditions. Transistors 306 and 312 are arranged in a cascode amplifier configuration, and provide a first stage of controlled amplification for the I.F. signal.

An external tuned circuit 320 is coupled to the external contact terminal 316 by a resistor 318. The I.F. signal is then coupled from the tuned circuit 320 to the input of a second I.F. amplifier 330 by way of external contact terminal 322. The external contact terminal 322 is coupled to the base of a buffer transistor 332, which has its collector coupled to the +V supply and its emitter coupled to ground by a resistor 334.

The second I.F. amplifier 330 is configured in the same manner as the first I.F. amplifier 300, and is comprised of the buffer transistor 332, a cascode amplifier including transistors 336 and 342, a PIN diode 338 coupled from the emitter of common emitter transistor 336 to ground, and associated resistive components. The output of the second I.F. amplifier 330 is coupled from the collector of transistor 342 to an external tuned circuit 350 by an external contact terminal 346. The amplified I.F. signal is then supplied by the tuned circuit 350 to a third I.F. amplifier (not shown) for further amplification and subsequent signal processing. The first and second I.F. amplifiers are described in further detail in my copending U.S. patent application Ser. No. 021,324, entitled "GAIN CONTROLLED AMPLIFIER AND PIN DIODE FOR USE THEREIN", concurrently filed herewith.

The gain of I.F. amplifiers 300 and 330 is controlled by an I.F. gain control voltage developed from an AGC control voltage generated by AGC circuit 400. The AGC circuit 400 may illustratively be of the type which develops an AGC control voltage which varies in relation to the level of the detected video signal, such as that described in U.S. patent application Ser. No. 934,823, filed Aug. 18, 1978 and entitled "KEYED AGC CIRCUIT". The AGC control voltage is applied to the base of a transistor 372 in a dummy bias circuit 370 by the serial connection of resistors 362 and 364 from external contact terminal 402. The collector of transistor 372 is coupled to the +V supply, and its emitter is coupled to the base of a transistor 376 and to ground by a resistor 374. Transistor 376 has its emitter coupled to ground by a PIN diode 378, and its collector is coupled to an I.F. AGC bus 360. The I.F. AGC bus 360 is coupled to the base of transistor 372 by a capacitor 368 and is also coupled to the junction of resistors 362 and 364 by a resistor 366.

The dummy bias circuit 370 is so named because it controls the biasing current provided to the first and second I.F. amplifiers 300 and 330 and an R.F. AGC circuit 150, and is arranged to have a geometry which is a replica, or dummy, of that of the I.F. amplifiers and R.F. AGC circuit. Specifically, it can be seen that the dummy bias circuit 370 has three base-to-emitter (3 $V_{be}$) voltage drops between the base of transistor 372 and the grounded cathode of PIN diode 378, which matches the similar 3 $V_{be}$ arrangements of the I.F. amplifiers and R.F. AGC biasing circuit. Since the dummy bias circuit 370 is a replica of the first and second I.F. amplifiers 300 and 330, the quiescent collector-to-emitter current of transistor 376 will be replicated as a quiescent D.C. biasing current in the collector-to-emitter paths of transistors 306 and 336 in current mirror fashion. The ratio of the current flowing through transistor 376 to the currents flowing through the I.F. amplifier transistors is a function of the emitter areas of the respective transistors. In the example illustratively shown in the FIGURE, the emitter areas of transistors 306 and 336 are selected to be twice the emitter area of transistor 376. This means that, in the absence of AGC control (i.e., quiescent condition), a one milliampere flow of current through transistor 376 will be replicated as a two milliampere current flow in each of the transistors 306 and 336. The emitter areas of the respective transistors may obviously be scaled in other ratios if different quiescent biasing currents are desired in the I.F. amplifiers. The dummy bias circuit 370 may also be utilized to provide parallel quiescent biasing of more than two amplifiers if this is desired.

The I.F. AGC voltage on the bus 360 is applied to the base of transistor 302 of the first I.F. amplifier 300 by the serial connection of resistors 382 and 384. A capacitor 386 is coupled from the junction of resistors 382 and 384 to ground, which provides filter isolation of the I.F. AGC bus 360 from the I.F. signals at the base of transistor 302. Similarly, the I.F. AGC voltage is applied to the base of transistor 332 by the serial connection of resistors 390 and 392 from the I.F. AGC bus 360. The I.F. AGC bus 360 is isolated from the I.F. signal at the base of transistor 332 by a capacitor 394, which is coupled to ground from the junction of resistors 390 and 392 to provide low-pass filtering of the I.F. AGC voltage at that point. The I.F. AGC voltage is also applied to an R.F. AGC biasing circuit 150 by an isolation resistor 380.

The R.F. AGC biasing circuit 150 responds to a decreasing I.F. AGC voltage at its input by generating a delayed R.F. AGC voltage, which is applied to the tuner in the television receiver (not shown). The isolation resistor 380 is coupled to the base of a transistor 154, which is also bypassed to ground by a capacitor 152. The collector of transistor 154 is coupled to the +V supply, and its emitter is coupled to ground by a resistor 156, and to the base of a transistor 160 by a resistor 158. The emitter of transistor 160 is coupled to ground by a forward biased PIN diode 162, and its collector is coupled to the base of a transistor 166 and to a variable AGC delay resistor 190. The setting of the AGC delay resistor 190 determined the bias point (i.e., the voltage level on the I.F. AGC bus 360) at which R.F. gain reduction is initiated by the R.F. AGC biasing circuit. A zener diode 164 has its anode coupled to the base of transistor 160 and its cathode coupled to the collector of transistor 160. The zener diode 164 operates as a dynamic range clamp to prevent large increases in the collector voltage of transistor 160, which can occur during channel switching. If the television receiver momentarily receives a very strong broadcast signal during channel switching, the AGC system will react by reducing the gain of the R.F. and I.F. amplifiers. Such gain reduction will cause transistor 160 to become nonconducting, and without the zener diode 164, its collector voltage can rise to the level of the +V supply which is coupled to the variable resistor 190. If the channel selector finally stops at a channel which is receiving a weak broadcast signal, the tuner should be operated in a high gain condition, and transistor 160 will have to become conducting to reduce its collector voltage to increase the R.F. gain. However, the AGC system contains many delays which can slow this recovery by the R.F. AGC biasing circuit 150, and may include a capacitor coupled to the collector of transistor 160. The zener diode prevents such slow recovery by the R.F. AGC biasing circuit by clamping the collector voltage of transistor 160 at a maximum level from which the circuit may promptly recover.

As mentioned previously, the input circuitry of the R.F. AGC biasing circuit including transistors 154 and 160 and PIN diode 162, is a 3 $V_{be}$ circuit which matches the biasing of the dummy bias circuit 370. Since the R.F. AGC biasing circuit 150 is operated at very low current levels as compared to the I.F. amplifiers in the example shown in the FIGURE, the emitter area of transistor 160 is chosen to be much smaller than that of transistor 376. This means that the collector-to-emitter current in transistor 160 will be less than the collector-to-emitter current in the matched transistor 376 in the dummy bias circuit 370.

Transistor 166 has a collector coupled to the +V supply, and an emitter coupled to the base of a transistor 168. Transistor 168 has a collector coupled to the +V supply and develops a forward AGC voltage for the tuner in the television receiver at an emitter electrode 170. Transistor 168 has a second electrode 172 which is coupled to ground by the serial connection of resistors 174 and 176. The junction of resistors 174 and 176 is coupled to the base of a transistor 180, which has an emitter coupled to ground by a resistor 182, and develops a reverse R.F. AGC voltage at its collector electrode. The R.F. AGC biasing circuit 150 thus develops both a forward and a reverse AGC voltage, thereby permitting its use with a tuner which requires either gain control technique. It may also be noted that the range of the reverse R.F. AGC voltage is not fixed, but is determined by the user through the choice of the load impedance at the R.F. AGC output.

A multiple $V_{be}$ biasing circuit 600 acts as a voltage source for the I.F. AGC bus 360 and transistor 376. A transistor 602 has its collector coupled to the +V supply by a resistor 610 and its emitter coupled to the I.F. AGC bus 360 by a resistor 608. A resistor 604 is coupled from the collector to the base of transistor 602, and a resistor 606 is coupled from the base to the emitter of transistor 602. When resistors 604 and 606 are chosen to have the values illustratively shown in the FIGURE, the voltage across resistor 606 is maintained at 1 $V_{be}$ (approximately 0.7 volts) by the voltage across the parallel base-to-emitter path of transistor 602. Since resistors 604 and 606 are in a ratio of approximately five to one in this example, a 5 $V_{be}$ voltage drop will appear across resistor 604, for a total of 6 $V_{be}$'s between the collector and emitter of the transistor 602. Thus, the voltage at the emitter of transistor 602 (and also the I.F. AGC bus 360) remains at a level which is approximately 6 $V_{be}$'s below the voltage level at the collector of the transistor. In the absence of a gain control voltage from AGC circuit 400 (i.e., operation in a maximum gain condition), the voltage on the I.F. AGC bus 360 is maintained at approximately 3 $V_{be}$'s above ground by the dummy bias curcuit 370. Under these conditions, the voltage applied to the bases of the common base cascode amplifier transistors 312 and 342 is approximately 9 $V_{be}$'s above ground potential.

It is desirable to bias the cascode amplifiers 306, 312 and 336, 342 such that half of the +V supply voltage is dropped across each of the two cascode transistors in a quiescent state. For instance, when the +V supply is chosen to have a value of +12 volts, this voltage is effectively applied to the collectors of the common base cascode transistors 312 and 342 by the tuned circuits 320 and 350, respectively. Therefore, it is desired to bias the cascode amplifiers so that a six volt D.C. level appears at the collector of transistors 306 and 336. The voltage at the bases of transistors 312 and 342 will thus be 1 $V_{be}$ higher than six volts. Since the bases of transistors 312 and 342 are biased at 9 $V_{be}$'s by the dummy bias circuit 370 and the multiple $V_{be}$ biasing circuit 600, which is approximately 6.3 volts, it is seen that the cascode amplifiers are properly biased under quiescent conditions by this arrangement.

In operation, the AGC circuit 400 develops an AGC control voltage which is directly related to the level of the detected video signal; a weak (low level) video signal will result in the generation of a low level AGC control voltage, and a strong (high level) video signal will result in the generation of a high level AGC control voltage. Under weak signal conditions, the low level AGC control voltage is applied to the dummy bias circuit 370, causing little change in the quiescent conduction state of transistors 372 and 376. The voltage on the I.F. AGC bus 360 will therefore be at a high level of approximately 3 $V_{be}$'s. This high level I.F. AGC voltage is applied to the I.F. amplifiers 300 and 330 at the bases of transistors 302 and 332. Transistors 302, 306 and 332, 336 will thus conduct heavily, and high D.C. bias currents will be supplied to PIN diodes 308 and 338 by the transistors 306 and 336, respectively. The large bias currents will cause the PIN diodes to have low resistances, thereby providing low emitter resistances for transistors 306 and 336. The cascode amplifiers 306, 312 and 336, 342 will then provide substantial amplification for the weak I.F. signal provided by I.F. signal source 200.

As the video signal level increases with an increase in the level of the received R.F. television signal, the level of the AGC control voltage developed by the AGC circuit 400 increases. The increasing AGC control voltage causes increased current flow through resistor 362 to the dummy bias circuit 370 and the I.F. AGC bus 360. The dummy bias circuit 370 will respond to the flow of current from the AGC circuit 400 by attempting to maintain the voltage level at the base of transistor 372 at approximately 3 $V_{be}$'s. This is accomplished by increased conduction by transistor 376. Substantially all of the increased current flow from the AGC circuit 400 is conducted to the I.F. AGC bus by resistor 366 and then to ground by transistor 376, which causes a voltage drop across resistor 366. The voltage drop across resistor 366 will cause the voltage on the I.F. AGC bus to fall below the 3 $V_{be}$ level at the base of transistor 372. At this time, transistor 376 is conducting substantially all of the current provided by the AGC circuit 400 by way of resistor 366, as well as the quiescent current supplied by the multiple $V_{be}$ biasing circuit 600.

The decreased I.F. AGC voltage on the bus 360 is applied to the bases of transistors 302 and 332 by way of resistors 382, 384 and 390, 392, respectively, causing a reduction in the transconductance of transistors 306 and 336. By reason of the decreased transconductance of transistors 306 and 336, the D.C. bias currents supplied to PIN diodes 308 and 338 by transistors 306 and 336, respectively, decrease, and the resistance of the PIN diodes 308 and 338 increase. The increased emitter impedances of transistors 306 and 336 cause a reduction in the gain of the cascode amplifiers 306, 312 and 336, 342. Moreover, since the multiple $V_{be}$ biasing circuit is coupled to maintain a constant 6 $V_{be}$ voltage difference between the I.F. AGC bus 360 and the bases of the cascode transistors 312 and 342, it can be seen that the D.C. bias supplied to transistors 312 and 342 will track the decreasing voltage level on the I.F. AGC bus 360.

The current supplied by AGC circuit 400 will continue to increase as the video signal level increases, and the increasing voltage drop across resistor 366 will continue to lower the level of the I.F. AGC voltage on bus 360. The decreasing I.F. AGC voltage will continue to lower the $g_m$ of the I.F. amplifier transistors 306 and 336, and the resistances of the PIN diodes 308 and 338 will continue to increase. The $g_m$ of transistors 306 and 336 will eventually reach a minimum level at which the voltage gain of the I.F. amplifiers is approximately unity and the full range of I.F. gain reduction has been traversed. Any further gain reduction occurs in the tuner under the control of the delayed R.F. AGC circuit 150.

As the I.F. amplifiers approach the limit of I.F. gain reduction, the low I.F. AGC voltage which is applied to the base of transistor 154 by way of the isolation resistor 102 causes that transistor to reduce its conduction. The voltage at the emitter of transistor 154 will decrease as the transistor is turned off, which causes transistor 160 to reduce its conduction. The voltage at the collector of transistor 160 will increase at a rate determined by the setting of the variable R.F. AGC delay resistor 190 as transistor 160 is turned off. Eventually, a voltage level will be reached at the base of transistor 166 which is sufficient to turn that transistor on, which in turn will cause transistor 168 to begin conduction. Current will then flow through the first emitter 170 of transistor 168, which may be used to develop a forward AGC voltage for the tuner. Simultaneously, current will flow through the second emitter 172 of transistor 168, which will cause transistor 180 to begin conduction. Current will then flow through the collector of transistor 180, in an opposite polarity to the current flow in the first emitter 170 of transistor 168. The collector current of transistor 180 may be used to develop a reverse AGC voltage for the tuner.

The multiple $V_{be}$ biasing circuit 600 will modify the bias current supplied by resistor 610 as a function of temperature in a manner which compensates for the normal $g_m$ reduction of amplifying transistors 306 and 336 with increasing temperature. As previously mentioned, the collector of transistor 602 is a 9 $V_{be}$ quiescent biasing point by reason of the dummy biasing circuit 370 and the multiple $V_{be}$ biasing circuit 600. This biasing point has a negative temperature coefficient which is a function of the number of $V_{be}$'s of biasing potential at that point.

The base-to-emitter voltage of a transistor may be expressed to a first approximation as $$V_{be} = \frac{kT}{q} \ln \frac{I_E}{I_{sat}}$$

where $I_E$ is the emitter current and $I_{sat}$ is the saturation current of the transistor. Although there is a temperature term T in the numerator of the k T/q expression, $V_{be}$ is in fact inversely related to temperature, due to the extreme temperature dependence of $I_{sat}$. The $V_{be}$ of a transistor decreases with increasing temperature by reason of this dominance of the $I_{sat}$ term in the $V_{be}$ expression.

The temperature dependence of $V_{be}$ may be expressed in terms of the change in $V_{be}$ for constant $I_E$. By reason of the temperature dependence of the saturation current, the following result is obtained:

$$\left.\frac{dV_{be}}{dT}\right|_{I_E = constant} \approx -2 \text{ mv/degree C.}$$

This value has been found to be nearly constant for all types of transistors, and all normal values of $I_E$. Consequently, the 9 $V_{be}$ quiescent biasing point at the collector of transistor 602 has a negative temperature coefficient of $-18$ mv/degree C. This means that the voltage at the collector of transistor 602 will decrease by 18 millivolts for every degree of increase in the ambient temperature of the circuit.

It has previously stated that the 9 $V_{be}$ point at the collector of transistor 602 will remain at approximately 6.3 volts in the absence of AGC control by the AGC circuit 400 and the dummy bias circuit 370. When the voltage on the I.F. AGC bus 360 is decreased during AGC operation by the dummy bias circuit 370, the voltage at the 9 $V_{be}$ point will decrease slightly, but will be maintained at a voltage level which is 6 $V_{be}$'s above the voltage level of the I.F. AGC bus. On the average, the voltage at the collector of transistor 602 will be approximately six volts.

When the 1,000 ohm value illustratively shown for resistor 610 in the FIGURE is used in conjunction with a +12 volt source for the +V supply, it may be seen that there will be a six volt drop across the resistor, which will conduct six milliamperes of current to the multiple $V_{be}$ biasing circuit 600. This current is conducted to the I.F. AGC bus 360 by the multiple $V_{be}$ biasing circuit 600 and thence to ground by transistor 376 of the dummy bias circuit 370. This six milliampere current flow through transistor 376 will be replicated through the cascode amplifiers 366, 312 and 336, 342 in a two-to-one ratio by virtue of the two-to-one scaling of the emitter areas of transistors 306 and 336 as compared to transistor 376. Thus, the six milliampere current flow through transistor 376 will result in a twelve milliampere collector current flow in each of transistors 306 and 336. When these values are substituted in $g_m$ equation (2), the following result is obtained at room temperature (290° K.):

$$g_m = \frac{q}{kT} |I_c| = \frac{(1.6 \times 10^{-19} \text{coul.}) (12 \times 10^{-3} \text{amps.})}{(1.38 \times 10^{-23} \text{ J/°K.}) (290° \text{ K.})}$$

$$g_m = 4.79 \times 10^{-1} \frac{\text{amps.}}{\text{volt}} = .479 \text{ mhos}$$

As the temperature of the circuit shown in the FIGURE increases from room temperature to its maximum nominal operating temperature of 55° C. above room temperature (345° K.), the $V_{be}$'s of the transistors in the circuit will decrease by 2 mv for every degree C. increase in temperature. Consequently, the 3 $V_{be}$ point at the collector of transistor 376 will decrease by 330 mv during the 55° C. temperature increase. The base-to-emitter voltage of transistor 602 will also decrease by 2 mv/°C., causing the voltage across resistor 606 to decrease. The voltage across resistor 604 of the voltage divider 604, 606 will decrease by an amount determined by the ratio of the voltage divider resistors, which in the example shown in the FIGURE is five to one. Thus, the total voltage drop across the multiple $V_{be}$ biasing circuit 600 will be equal to that of 6 $V_{be}$'s, or 660 mv for a 55°

C. temperature increase. The total voltage drop at the 9 $V_{be}$ biasing point at the collector of transistor 602 will therefore be approximately one volt, which result is also obtained by multiplying the $-18$ mv/°C. temperature coefficient at that point by the 55° C. temperature change.

This decrease in the voltage level at the collector of transistor 602 will result in a seven volt drop across resistor 610, which will then conduct seven milliamperes of current to the dummy bias circuit 370 by way of the multiple $V_{be}$ biasing circuit 600. The seven milliampere current flow through transistor 376 will be replicated in a two-to-one ratio in transistors 306 and 336, which will now have collector currents of fourteen milliamperes each. When these values are substituted in the $g_m$ equation (2), the result is:

$$g_m = \frac{q}{kT}|Ic| = \frac{(1.6 \times 10^{-19} \text{coul.})(14 \times 10^{-3} \text{amps.})}{(1.38 \times 10^{-23} J/°K.)(245° K.)}$$

$$g_m = 4.7 \times 10^{-1} \frac{\text{amps.}}{\text{volt}} = .47 \text{ mhos}$$

which is the same as the $g_m$ value obtained above for room temperature operation. It therefore can be seen that the multiple $V_{be}$ biasing circuit in the example shown in the FIGURE will stabilize the $g_m$ of the I.F. amplifier against variations in operating temperature.

What is claimed is:

1. Apparatus for compensating the gain of a transistor, including a base-to-emitter junction, against gain variation due to temperature changes comprising:
    a source of operating potential having first and second terminals; and
    a temperature compensating bias circuit, serially coupled between said first and second terminals, comprising:
    first means, having a first terminal coupled to said first source terminal, and a second terminal, for conducting current, and exhibiting a base-to-emitter semiconductor junction voltage drop between its first and second terminals which varies with temperature changes;
    second means, having a first terminal coupled to the second terminal of said first means, and a second terminal, for conducting current, and exhibiting a voltage drop which is a constant multiple of said base-to-emitter semiconductor junction voltage drop of said first current conducting means;
    third means, coupled between the second terminal of said second means and said second source terminal, for conducting current, and exhibiting an impedance which is substantially constant with changes in temperature; and
    means for coupling the base-to-emitter junction of said transistor in parallel with said first means,
    wherein the current conducted by said first means is replicated by said transistor in a substantially constant proportionate relationship so that the current conducted by said transistor is increased with increasing temperature, whereby the gain of said transistor is stabilized in the presence of temperature changes.

2. The apparatus of claim 1, wherein said transistor and said first and second current conducting means are fabricated in a single monolithic integrated circuit chip.

3. The apparatus of claim 1, wherein said first current conducting means comprises a base-to-emitter semiconductor junction, said third current conducting means comprises a first resistor, and said second current conducting means comprises a second transistor having a second resistor coupled from its base to its emitter and a third resistor coupled from its collector to its base,
    wherein the voltage drop across said second resistor is one base-to-emitter voltage drop and the voltage drop across said third resistor is related to the voltage drop across said second resistor in a relationship determined by the ratio of said third resistor to said second resistor.

4. Apparatus for compensating the gain of a transistor, including a base-to-emitter junction, against gain variation due to temperature changes comprising:
    a source of operating potential having first and second terminals; and
    a temperature compensating bias circuit, serially coupled in the following order between said first and second terminals, comprising:
    first means for conducting current having a base-to-emitter semiconductor junction voltage drop which varies with temperature changes;
    second means for conducting current having a voltage drop which is a constant multiple of said base-to-emitter semiconductor junction voltage drop of said first current conducting means, said multiple voltage drop varying in constant relation to that of said first current conducting means with changes in temperature; and
    third means for conducting current having an impedance which is substantially constant with changes in temperature;
    wherein the base-to-emitter path of said transistor is coupled between the junction of said first and second current conducting means and said first terminal of said source of operating potential,
    wherein said first current conducting means comprises a base-to-emitter semiconductor junction, said third current conducting means comprises a first resistor, and said second current conducting means comprises a second transistor having a second resistor coupled from its base to its emitter and a third resistor coupled from its collector to its base,
    wherein the voltage drop across said second resistor is one base-to-emitter voltage drop and the voltage drop across said third resistor is related to the voltage drop across said second resistor in a relationship determined by the ratio of said third resistor to said second resistor; and
    a third transistor having an emitter electrode coupled to the collector electrode of said first-named transistor, a base electrode coupled to the junction of said first resistor and said second current conducting means, and a collector electrode coupled to said second terminal of said source of operating potential such that said first-named transistor and said third transistor comprise a cascode amplifier,
    wherein the ratio of said third resistor to said second resistor is selected such that the potential at the base electrode of said third transistor is substantially equal to one-half the potential between said first and second terminals of said source of operating potential.

5. Apparatus for compensating the gain of a transistor, including a base-to-emitter junction, against gain variation due to temperature changes comprising:

a source of operating potential having first and second terminals; and a temperature compensating bias circuit, serially coupled in the following order between said first and second terminals, comprising:

first means for conducting current having a base-to-emitter semiconductor junction voltage drop which varies with temperature changes;

second means for conducting current having a voltage drop which is a constant multiple of said base-to-emitter semiconductor junction voltage drop of said first current conducting means, said multiple voltage drop varying in constant relation to that of said first current conducting means with changes in temperature; and third means for conducting current having an impedance which is substantially constant with changes in temperature;

wherein the base-to-emitter path of said transistor is coupled between the junction of said first and second current conducting means and said first terminal of said source of operating potential;

wherein said first current conducting means comprises:

a second transistor having a base electrode, an emitter electrode, and a collector electrode coupled to the base electrode of said first-named transistor, a resistor coupled between the collector and base electrodes of said second transistor, and a first PIN diode coupled between the emitter electrode of said second transistor and said first terminal, said second current conducting means being coupled to the collector electrode of said second transistor;

said apparatus further comprising:

a second PIN diode coupled between the emitter electrode of said first-named transistor and said first terminal;

whereby bias current flowing through the serial connection of the collector-to-emitter path of said second transistor and said first PIN diode is related to the bias current flowing through the serial connection of the collector-to-emitter path of said first transistor and said second PIN diode in proportion to the ratio of the emitter area of said second transistor to the emitter area of said first transistor.

6. A temperature compensated transistor amplifier comprising:

a source of operating potential having first and second terminals;

a first transistor having a base-to-emitter path, an input coupled to receive signals which are to be amplified, and an output;

a temperature compensating bias circuit for increasing the current conducted by said first transistor in the presence of temperature increases including:

a resistor, a second transistor having a base electrode and a collector-to-emitter path, a voltage divider coupled in parallel with the collector-to-emitter path of said second transistor and having an intermediate tap coupled to said base electrode of said second transistor, and a rectifying junction, wherein said resistor, the collector-to-emitter path of said second transistor and said rectifying junction are serially coupled in that order between said first and second terminals;

means for coupling the junction of said second transistor and said rectifying junction to the base-to-emitter path of said first transistor, wherein said coupling means and said base-to-emitter path of said transistor are serially coupled in parallel with said rectifying junction.

7. A temperature compensated transistor amplifier comprising:

a source of operating potential having first and second terminals;

an amplifier having an input terminal and including a first transistor having a base-to-emitter path coupled between said input terminal and said second terminal; and means for supplying to said amplifier a bias current subject to variations with temperature changes of such magnitude and sense as to maintain the gain of said amplifier substantially constant in the presence of temperature changes, wherein said bias current supplying means comprises a resistor coupled to said first terminal, a rectifying semiconductor junction coupled between said input terminal of said amplifier and said second terminal, and the parallel combination of the collector-to-emitter path of a second transistor and a voltage divider coupled between said resistor and said rectifying junction, the base of said second transistor being coupled to an intermediate tap of said voltage divider.

8. The temperature compensated transistor amplifier of claim 7, wherein said rectifying semiconductor junction comprises a third transistor having a base electrode, an emitter electrode coupled to said second terminal, and a collector electrode coupled to the base-to-emitter path of said first transistor, and said bias current supplying means further comprises a second resistor coupled between said collector and base electrodes of said third transistor.

9. A temperature compensated transistor amplifier comprising:

a source of operating potential having first and second terminals;

an amplifier having an input terminal and including a first transistor having a base-to-emitter path coupled between said input terminal and said second terminal;

means for supplying to said amplifier a bias current subject to variations with temperature changes of such magnitude and sense as to maintain the gain of said amplifier substantially constant in the presence of temperature changes, wherein said bias current supplying means comprises a resistor coupled to said first terminal, a rectifying semiconductor junction coupled between said input terminal of said amplifier and said second terminal, and the parallel combination of the collector-to-emitter path of a second transistor and a voltage divider coupled between said resistor and said rectifying junction, the base of said second transistor being coupled to an intermediate tap of said voltage divider, wherein said rectifying semiconductor junction comprises a third transistor having a base electrode, an emitter electrode coupled to said second terminal, and a collector electrode coupled to the base-to-emitter path of said first transistor, and said bias current supplying means further comprises a second resistor coupled between said collector and base electrodes of said third transistor; and a source of gain control voltage coupled to the base electrode of said third transistor, whereby said third transistor is responsive to said gain control voltage for controlling the bias current supplied to said first transistor so as to control the gain of said first transistor.

10. A temperature compensated transistor amplifier comprising:

a first transistor, the gain of which is to be compensated for temperature variations, having a base-to-emitter path and a collector electrode;

a load impedance coupled to said collector electrode;

a source of input signals coupled to said base-to-emitter path of said first transistor;

a first resistor coupled to one terminal of a source of operating potential;

a rectifying semiconductor junction coupled to another terminal of said source of operating potential;

a second transistor having a base electrode and a collector-to-emitter path serially coupled between said first resistor and said rectifying junction;

a voltage divider coupled in parallel with said collector-to-emitter path of said second transistor and having an intermediate tap coupled to said base electrode of said second transistor; and a second resistor coupled between the junction of said second transistor and said rectifying junction and said base-to-emitter path of said first transistor, wherein said first resistor, said rectifying semiconductor junction, and said second transistor conduct an increasing amount of current in the presence of increasing temperature so as to cause an increase in the current conducted by said first transistor, whereby the gain of said first transistor is stabilized in the presence of said increasing temperature.

11. Apparatus for stabilizing the gain of a gain controlled amplifier against changes due to temperature variation comprising:

a source of operating potential having first and second terminals;

an amplifying transistor having first, second and third electrodes, said first electrode being coupled to said second terminal;

means for applying input signals to said second electrode of said amplifying transistor;

a gain control transistor having a first electrode coupled to said second terminal, a second electrode responsive to a variable gain control voltage and a third electrode coupled to said second electrode of said amplifying transistor;

means for coupling said second electrode of said gain control transistor to said second electrode of said amplifying transistor;

a resistor coupled to said first terminal; and a biasing circuit, coupled between said resistor and said third electrode of said gain control transistor, and having a voltage drop thereacross which varies with variations in temperature.

12. The apparatus of claim 11, wherein the current conducted by said biasing circuit increases with increasing temperature.

13. The apparatus of claim 11, wherein said amplifying transistor, and gain control transistor, said coupling means, and said biasing circuit are fabricated on a single monolithic integrated circuit chip.

14. The apparatus of claim 11, wherein said first, second and third electrodes of said amplifying and said gain control transistors correspond to the emitter, base and collector electrodes of said transistors, respectively.

15. The apparatus of claim 14, wherein the voltage developed at the collector electrode of said gain control transistor varies inversely in response to changes in said variable gain control voltage.

* * * * *